US009327481B2

(12) United States Patent
Winkler et al.

(10) Patent No.: US 9,327,481 B2
(45) Date of Patent: May 3, 2016

(54) METHOD OF MAKING A COATED AMORPHOUS METAL PART

(75) Inventors: Yves Winkler, Schmitten (CH); Jean-Francois Dionne, Kerzers (CH); Stewes Bourban, Cudrefin (CH); Alban Dubach, Bienne (CH); Yann Fallet, Savagnier (CH)

(73) Assignee: The Swatch Group Research and Development Ltd., Marin (CH)

( * ) Notice: Subject to any disclaimer, the term of this patent is extended or adjusted under 35 U.S.C. 154(b) by 621 days.

(21) Appl. No.: 13/701,971

(22) PCT Filed: Jun. 1, 2011

(86) PCT No.: PCT/EP2011/059156
§ 371 (c)(1),
(2), (4) Date: Mar. 12, 2013

(87) PCT Pub. No.: WO2011/154312
PCT Pub. Date: Dec. 15, 2011

(65) Prior Publication Data
US 2013/0167606 A1  Jul. 4, 2013

(30) Foreign Application Priority Data
Jun. 8, 2010 (EP) .................................. 10165287

(51) Int. Cl.
*C23C 16/01* (2006.01)
*C23C 16/06* (2006.01)
*B32B 37/24* (2006.01)
*C22C 16/00* (2006.01)

(52) U.S. Cl.
CPC ................. *B32B 37/24* (2013.01); *C22C 16/00* (2013.01); *C23C 16/01* (2013.01); *C23C 16/06* (2013.01)

(58) Field of Classification Search
None
See application file for complete search history.

(56) References Cited

U.S. PATENT DOCUMENTS

| 5,288,344 | A | * | 2/1994 | Peker | ...................... | C22C 45/10 148/403 |
| 5,567,251 | A | * | 10/1996 | Peker | .................... | B22D 19/14 148/522 |
| 5,896,642 | A | * | 4/1999 | Peker et al. | ................... | 29/522.1 |
| 6,453,977 | B2 | * | 9/2002 | Onuki et al. | .................... | 164/80 |
| 2006/0113575 | A1 | | 6/2006 | Jang et al. | | |
| 2011/0162795 | A1 | * | 7/2011 | Pham et al. | ................. | 156/309.9 |

FOREIGN PATENT DOCUMENTS

| JP | 11 323454 | 11/1999 |
| WO | 2006 118511 | 11/2006 |

OTHER PUBLICATIONS

International Search Report Issued Jul. 22, 2011 in PCT/EP11/59156 Filed Jun. 1, 2011.
U.S. Appl. No. 13/701,970, filed Dec. 4, 2012, Winkler, et al.
U.S. Appl. No. 13/703,519, filed Dec. 11, 2012, Winkler, et al.

* cited by examiner

*Primary Examiner* — George Wyszomierski
(74) *Attorney, Agent, or Firm* — Oblon, McClelland, Maier & Neustadt, L.L.P.

(57) ABSTRACT

A method of producing a first part having at least one surface, formed of a first material. The first part includes at least one coating on the at least one surface. The production method includes: a) taking a second part including a cavity forming the negative of the first part; b) depositing the coating, including at least a first layer, onto the second part; c) taking a first metallic material, chosen for its ability to become at least partially amorphous; d) shaping the first material in the cavity of the second part so as to secure the coating to the at least one surface of the first part, the first material having been subject to a treatment allowing it to become at least partially amorphous, at the latest at the time of the shaping operation; e) separating the first part from the second part so as to obtain the first part coated with the coating.

22 Claims, 4 Drawing Sheets

METHOD OF MAKING A COATED AMORPHOUS METAL PART

CROSS-REFERENCE TO PRIORITY APPLICATIONS

This is a National Phase Application in the United States of International Patent Application PCT/EP2011/059156 filed Jun. 1, 2011, which claims priority on European Patent Application No. 10165287.3 of Jun. 8, 2010. The entire disclosures of the above patent applications are hereby incorporated by reference.

The present invention concerns a method of making a first part having at least one surface formed of a first material and coated with at least one coating on said at least one surface, said first material including at least one metallic element and being chosen for its ability to become at least partially amorphous when subject to an increase in temperature above its melting temperature which allows said material to lose any crystalline structure locally, followed by cooling to a temperature lower than its vitreous transition temperature allowing said material to become at least partially amorphous.

The technical field of the invention is the technical field of fine mechanics. More specifically, the invention concerns the technical field of methods of manufacturing coated amorphous metal parts.

BACKGROUND OF THE INVENTION

Depositing a coating on various parts is known, as are materials for various decorative or functional applications. The known methods for such depositions are typically chemical vapour deposition (CVD), physical vapour deposition (PVD) or electrodeposition for example.

However, these methods have the drawback of creating inhomogeneous thicknesses in the case of certain complex geometries, such as for example concave geometries. This may, for example, result in surface smoothing in the case of a surface known as "clous de Paris" within the field of horology.

Moreover, these methods have the drawback of not allowing much flexibility in the choice of pairs of substrate-layer materials. In fact, in practice, it is not possible to deposit any type of layer on any type of material with large thicknesses. This is due to various factors such as thermal stresses or the incompatible crystallographic structure of the substrate material and the material of the layer or other elements.

A method for depositing a diamond coating is also known which partly overcomes these drawbacks. This method, known from FR Patent No. 2 815 045, includes the following steps:

1) Forming the negative form of the part which it is desired to make, from silicon.
2) Depositing a 2 µm diamond layer on the negative by chemical vapour deposition (CVD).
3) Overmoulding the negative using an epoxy resin.
4) Selectively dissolving the negative with hydrofluoric acid without dissolving the epoxy resin or the diamond layer.

The drawback of this method is that it cannot be used for plastics or polymers or for crystalline metals. Indeed, the use of crystalline metal for this coating deposition method is not possible for several reasons.

First of all, metals do not generally have the adherence properties that a resin or plastic material may have. Indeed, epoxy is a polymer which, when it polymerises, has the properties of an adhesive with a good traction factor with materials such as wood, metal, glass, etc. Consequently, since metals have low adhesion properties, the application of the method disclosed in FR Patent No. 2 815 045 to a crystalline metal will not allow for deposition of a layer which will adhere to the part to be made.

Secondly, some characteristics of metals may prevent the use thereof in the method disclosed in the prior art. Thus, in general, for the metals to be able to be shaped in a mould, they must be placed in liquid form, i.e. melted. A certain number of metals have a melting temperature of more than 1000° C. Consequently, this type of melting temperature can damage the layer deposited on the negative, particularly if said layer is thin, or even damage the negative itself.

In addition to other characteristics which may discourage those skilled in the art from using metals in the method disclosed in the prior art, solidification shrinkage or the difference between the expansion coefficients of the layer and metal may be cited. Solidification shrinkage consists in a contraction of the metal on itself during solidification. This then leads to an approximately 5 to 7% reduction in the dimensions of the solid part compared to the dimensions of the negative. There is therefore a risk of delamination between the layer and solidified metal. This risk of delamination may also be caused by the difference between the expansion coefficients of the layer and the metal, the expansion coefficient of the metal being generally much larger than that of the layer.

Therefore, it is reasonable to assume that those skilled in the art would not have used the method disclosed in FR Patent No 2 815 045 to manufacture a metal part coated with a layer.

SUMMARY OF THE INVENTION

The invention concerns a method for making a first part which overcomes the drawbacks of the prior art by providing for the manufacture of a first part in a given material, hereafter called the "first material", coated with a coating wherein said layer exhibits good adhesion to the metal and there is a high level of flexibility in the choice of metal which will be coated and the coating which will be deposited. Said first material may be an alloy, metal or material comprising at least one metallic element.

The invention therefore concerns a method of making a first part which has at least one surface formed of a first material and which is coated with at least one coating on said at least one surface. Said first material comprises at least one metallic element and is chosen for its ability to become at least partially amorphous when subject to an increase in temperature above its melting temperature so that said first material loses any local crystalline structure followed by cooling to a temperature lower than its vitreous transition temperature so that said first material becomes at least partially amorphous, characterized in that the method includes the following steps:

a) Taking a second part comprising a cavity forming the negative form of the first part.
b) Depositing said coating, comprising at least a first layer, onto said second part.
c) Taking the first material.
d) Shaping the first material by filling said cavity of the second part with said first material so as to secure said coating to said at least one surface of said first part, said first material having been subject to a treatment allowing it to become at least partially amorphous, at the latest at the time of said shaping operation.
e) Separating the first part from the second part so as to obtain said first part coated with said coating.

One advantage of the present invention is that it greatly facilitates shaping, in particular in the case of a first at least partially amorphous material, and allows the creation of complex-shaped parts with greater precision. Indeed, amorphous metals have the particular characteristic of softening while remaining amorphous for a certain period of time within a given temperature range [Tg-Tx] (where Tx is the crystallisation temperature and Tg is the vitreous transition temperature) (for example for a $Zr_{41.24}Ti_{13.75}Cu_{12.5}Ni_{10}Be_{22.5}$ alloy: Tg=350° C., Tx=460° C.). It is therefore possible to shape these metals under relatively low stress and at a low temperature thus allowing a simplified process to be used. The use of this type of material also allows the very precise reproduction of fine geometries, since the viscosity of the alloy decreases sharply according to temperature within the temperature range [Tg-Tx] and the alloy thus adopts all the details of the negative. For example, for a platinum-based material, shaping occurs at around 300° C. for a viscosity of up to $10^3$ Pa·s for a pressure of 1 MPa, instead of a viscosity of $10^{12}$ Pa·s at temperature Tg.

Surprisingly, this ability to soften, within a relatively low temperature range [Tg-Tx], allows the amorphous metal to have a property of adherence that a crystalline metal does not possess.

Another advantage of the present invention is that it allows the deposition of a coating on amorphous metal without any risk of said metal crystallising, which would destroy some of its properties such as shapeability or the lack of solidification shrinkage. Indeed, it is possible for the deposition of a coating on a substrate to require a higher temperature for the method than the crystallisation temperature of the substrate. If the substrate is an amorphous metal, there is therefore a risk of crystallisation. With the present invention, this risk does not exist, since the coating is first of all deposited on the negative form, the material of which is chosen to be perfectly compatible with the coating. Therefore, the operating temperature of the method for depositing the coating on the second part is not applied to the amorphous metal, thereby removing any risk of crystallisation.

Advantageous embodiments of this coating deposition method form the subject of the dependent claims.

In a first advantageous embodiment, step e) consists in dissolving said second part.

In a second advantageous embodiment, step d) consists in shaping said first material only after it has been previously transformed into an at least partially amorphous preform, said preform being then subject to a temperature comprised between the vitreous transition temperature and the crystallisation temperature of the first material and then to a pressure forming operation followed by a cooling operation allowing said first material to preserve an at least partially amorphous nature.

In a third advantageous embodiment, shaping step d) is simultaneous with a treatment which makes said first material at least partially amorphous, by subjecting it to a temperature higher than its melting temperature followed by cooling at a lower temperature than its vitreous transition temperature, which allows said material to become at least partially amorphous, during a casting operation.

In a fourth advantageous embodiment, a means of adhesion is arranged on said coating so as to improve the adhesion between said coating and the first part.

In another advantageous embodiment, a means of adhesion is arranged on a layer forming said coating so as to improve the adhesion between said layer on the one hand and said first part or another layer of said coating on the other hand.

In another advantageous embodiment, the means of adhesion includes at least one recessed or projecting portion arranged on the coating.

In another advantageous embodiment, said at least one portion in relief is achieved via a variation of said coating deposition method.

In another advantageous embodiment, said at least one portion in relief is made by machining said coating.

In another advantageous embodiment, the means of adhesion includes an intermediate layer arranged between the layer of coating closest to the first part and the first part.

In another advantageous embodiment, said coating includes at least one second layer and the layer of coating closest to the first part is an intermediate layer acting as a means of adhesion between said coating and the first part.

In another advantageous embodiment, the intermediate layer has a chemical affinity with the first material and the layer of coating closest to the first part, or with the first material and the layer of coating on which said intermediate layer is deposited, for accelerating the atom interdiffusion process therefore improving the adhesion of said coating to said first part.

In another advantageous embodiment, the intermediate layer can melt to braze the layer of coating closest to the first part or the layer of coating on which said intermediate layer is deposited, with the first part during shaping step d) or after shaping step d) but prior to separation step e).

In another advantageous embodiment, after step e) of separating the first part from the second part, the method further includes step f) consisting in crystallising the first part so as to accelerate interdiffusion between the atoms of the coating and those of the first material.

In another advantageous embodiment, the first part further includes at least one other coating, said coatings being deposited on distinct surfaces of the first part.

In another advantageous embodiment, step b) uses the CVD or PVD or electrodeposition method for the deposition of said coating.

In another advantageous embodiment, said first material is totally amorphous.

In another advantageous embodiment, said first metallic material is an alloy.

In another advantageous embodiment, the composition of said first material is 41.2% atomic percent of Zr, 13.8% atomic percent of Ti, 12.5% atomic percent of Cu, 10% atomic percent of Ni and 22.5% atomic percent of Be.

One of the advantages of these embodiments is good adhesion. Indeed, adhesion can be improved by structuring the coating so that it has portions in relief. These portions in relief may take the form of recesses or projecting parts allowing the amorphous metal to become coated and thus to act as an adhering part, thereby improving adhesion.

BRIEF DESCRIPTION OF THE DRAWINGS

The objects, advantages and features of the method of forming a first part according to the present invention will appear more clearly in the following detailed description of at least one embodiment of the invention, given solely by way of non-limiting example and illustrated by the annexed drawings, in which.

DETAILED DESCRIPTION OF THE INVENTION

FIGS. 1 to 7 show the various steps of the method of forming a first part according to the present invention. This method allows a first part 5 to be formed with an external covering taking the form of a coating 3. This coating 3 is superficial, i.e. it is directly applied to the first part 5 on at least one of the contact surfaces thereof. This first part 5 is made of a first material. First part 5 may be a decorative or functional part, such as a watch case, gear train, watch bezel, independent part or an element of a system such as a watch. First part 5 may also act as a mould in which elements will be manufactured. Indeed, while it is advantageous to have coated decorative or functional parts, it may also be advantageous to have a mould possessing a specific coating 3, such as a diamond coating providing good resistance to abrasive materials.

Figure 1:
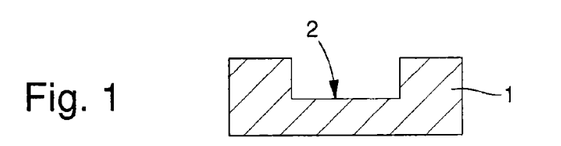
FIGS. 1 to 7 show schematically the steps of the method according to the present invention.

The first step shown in FIG. 1 consists in taking negative form hereinafter negative 1 of the first part 5 which is required to be manufactured and coated. To achieve this, a conventional mould making operation is carried out. This negative form 1, also called the second part, is formed of a material called the "second material". Negative 1 has a cavity 2 which is the cavity of the part to be made.

Figure 2:
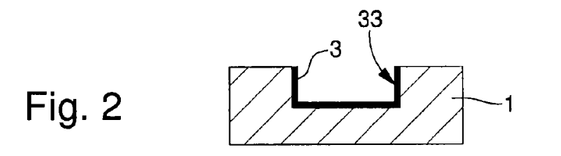

The second step, shown in FIG. 2, consists in depositing, on negative 1, the coating 3 which it is desired to apply to first part 5. To achieve this, the material forming coating 3 is taken. This material, called the "third material" determines the choice of the second material forming negative 1. Indeed, coating 3 is first of all deposited on negative 1 before being transferred to first part 5. Therefore, there is an advantage in the material of negative 1 being chosen to optimise the deposition of said coating 3 thus removing any incompatibility between the part to be coated and the material forming coating 3. For example, to deposit a diamond layer, a silicon negative will be used.

Figure 8:
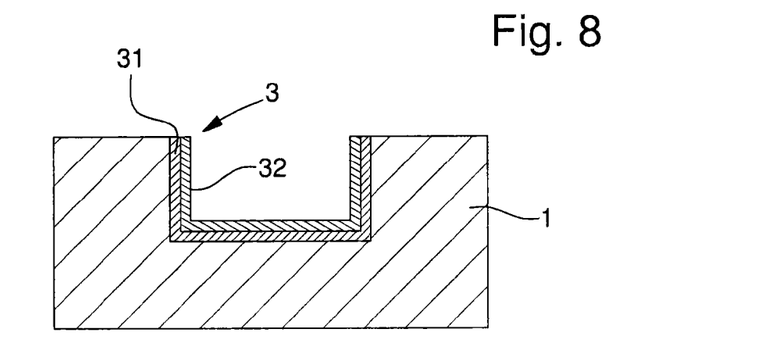
FIG. 8 is a schematic view of a coating with several layers.

The actual deposition consists in using a known deposition method such as chemical vapour deposition (CVD), physical vapour deposition (PVD) or electrodeposition or other method. It will be clear that the technique used may be dependent on the material to be deposited so as to optimise the deposition.

it is also possible for the coating to include several layers of different materials as seen in FIG. 8. Coating 3 then includes at least two layers, a first deposited layer 31, which is the layer which will face the external elements and a second layer 32, which is the last layer deposited and which will interact with the first material of first part 5. Thus, the superposing of various layers may provide decorative and mechanical advantages such as, for example, improved fatigue resistance or better tribological behaviour or improved shock resistance. For example, it is possible to have a gold layer on a DLC layer so as to combine the precious appearance of gold with the hardness characteristics of the DLC layer.

The coatings 3 that can typically be used are for example: diamond, diamond-like-carbon (DLC), titanium nitride (TiN), zirconium nitride (ZrN), titanium carbide (TiC), zirconium carbide (ZrC), silicon nitride ($Si_3N_4$), silicon dioxide ($SiO_2$), silicon carbide (SiC), boron nitride (BN), gold (Au), silver (Ag), nickel (Ni), chromium (Cr), palladium (Pd), platinum (Pt), silicon (Si), rhodium (Rh) or others. (The thicknesses must be between 0.1 µm to 10 µm for ceramic depositions and up to several hundred microns for metallic depositions).

It will be clear that the deposition of coating 3 is not carried out over the entire surface of negative 1 and may be carried out only over the surface of cavity 2 which has to be coated. it is also possible for only part of cavity 2 to be subject to the deposition of coating 3. Moreover, the external part could include several coatings, each coating being arranged on a surface of negative 1 corresponding to a surface of first part 5. Thus, it is possible to imagine the bottom of negative 1 having a diamond coating and the sides having a gold coating. However, it is also possible for the entire surface of negative 1 to be coated and the surplus coating 3 to be removed by mechanical or chemical means.

Figure 3:
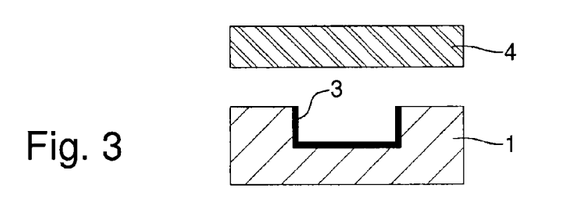

The third step, shown in FIG. 3, consists in taking the first material, i.e. the material forming first part 5. In order to make a coated metal part with good adhesion of the coating and a highly flexible choice of the metal and coating 3, the first material is an at least partially amorphous material. More particularly, the material is metallic, which means that it comprises at least one metallic element. The first material may be a homogeneous metal alloy or an at least partially or totally amorphous metal. The first material is therefore chosen for its ability to lose any local crystalline structure when the temperature rises above its melting temperature followed by cooling at a temperature below its vitreous transition temperature which allows said material to become at least partially amorphous.

Figure 4:
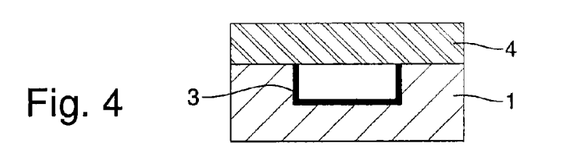
Figure 5:
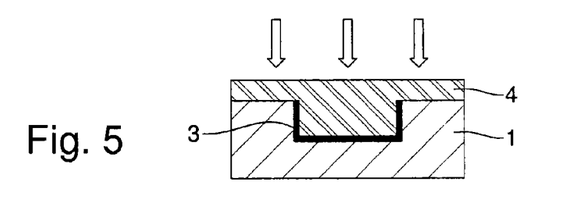
Figure 6:
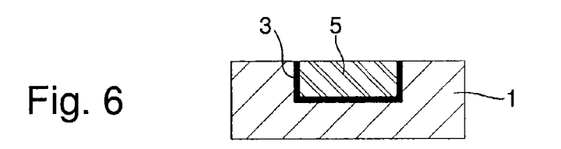

The fourth step, shown in FIGS. 4 to 6, consists in shaping the first material, which is amorphous metal here, so as to form the first part. To achieve this, the hot working method is used.

First of all, a preform 4 of amorphous material is made. This preform 4 consists of a part whose appearance and dimensions are similar to the final part. Typically, if it is desired to make, for example, a circular membrane, preform 4 will take the form of a disc. An important point is that said preform 4 already has an amorphous structure. To achieve this, the material or materials forming the first material are placed in the liquid state by raising the temperature above their melting temperature. They are then homogeneously mixed, if the first material includes several elements, to form said first material. This mixture is then cast in a mould of the desired shape and everything is cooled as quickly as possible so that the atoms do not have time to be structured. The first material then becomes at least partially amorphous.

Preform 4 is then arranged on negative 1 so as to cover it, as shown in FIG. 4. The hot press is then heated to a temperature specific to the material, preferably between its vitreous transition temperature Tg and its crystallisation temperature Tx.

Once the hot press is at temperature, pressure is then exerted on preform 4 to fill negative 1 as shown in FIG. 5. This pressing operation is carried out for a predefined time period.

This operation is possible since the advantage of amorphous metals is that they have the peculiar characteristic of softening while remaining amorphous within a given temperature range [Tg-Tx] peculiar to each alloy and at a low temperature, since these temperatures Tg and Tx are not high. This means that fine precise geometries can be very accurately reproduced since the viscosity of the alloy decreases sharply and the latter can easily be deformed to adopt all the details of cavity 2 of negative 1. Moreover, the low temperature necessary for shaping amorphous metals does not degrade negative 1 or coating 3.

Once the pressing time has passed, the first material is cooled to below Tg to form first part 5. The pressing and cooling must be sufficiently rapid to prevent the first material crystallising. Indeed, for a given first material at a given temperature between its vitreous transition temperature Tg and its crystallisation temperature Tx, there is a maximum duration beyond which said material crystallises. This duration decreases when the temperature gets close to its crystallisation temperature Tx and the duration increases when the temperature gets close to its vitreous transition temperature Tg. Thus, the amorphous material will crystallise if the time spent at a temperature comprised between Tg and Tx exceeds a certain specific value for each temperature/alloy pair. Typically for the Zr41.2Ti13.8Cu12.5Ni10Be22.5 alloy and a temperature of 440° C., the pressing time should not exceed around 120 seconds. Thus, the hot forming preserves the at least partially amorphous initial state of preform 4.

As a variant to this fourth step, it is possible to envisage using a casting method to make first part 5. This method consists in taking the first material which was obtained in the third step, without however subjecting it to a treatment to make it at least partially amorphous, and placing it in liquid form. Said first material is placed in liquid form by melting.

Once the first material is in liquid form, it is cast in cavity 2 of negative 1. When cavity 2 of negative 1 is filled or at least partially filled, the first material is then cooled to give it amorphous form. To achieve this, the first material is rapidly cooled so that the atoms of which it is formed are not arranged in crystalline form.

One advantage of casting a metal or alloy capable of being amorphous is that the melting temperature is low. Indeed, the melting temperatures of metals or alloys able to have an amorphous form are generally two to three times lower than those of conventional alloys for the same types of composition. For example, the melting temperature of the Zr41.2Ti13.8Cu12.5Ni10Be22.5 alloy is 750° C. compared to 1500-1700° C. for zirconium Zr and titanium Ti based alloys. This also avoids the risk of damaging coating 3 during casting.

Another advantage is that the solidification shrinkage of an amorphous metal is very low, less than 1% compared to 5 to 7% shrinkage for a crystalline metal. This advantage thus allows the principle of casting to be used without any fear of the shedding or delamination which would result from said shrinkage.

The surplus mechanical or chemical material is removed as shown in FIG. 6. The surplus can be removed prior to or after cooling.

Figure 7:
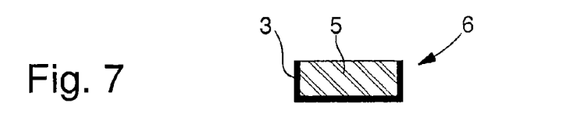

The fifth step, shown in FIG. 7, consists in separating the first coated part 6 from negative 1. To achieve this, negative 1, in which the amorphous metal was overmoulded to form first part 5, is mechanically removed or immersed in a chemical solution. This chemical solution is specifically selected to etch negative 1. Indeed, the object of this step is to dissolve negative 1 without dissolving either coating 3 or the first part 5 which is formed of amorphous metal. For example, in the case of a silicon negative 1, a potassium hydroxide or potash (KOH) solution is used to dissolve the silicon of negative 1. The final result is thus the obtention of the first coated amorphous metal part 6.

Figure 9:
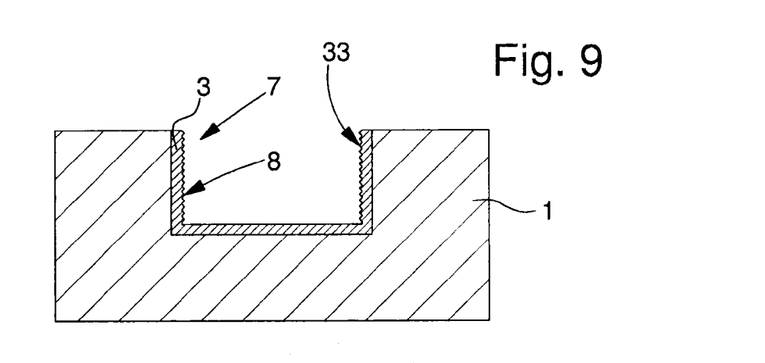
FIG. 9 shows a schematic view of a coating according to a first variant of the present invention.

In a first variant of the present invention seen in FIG. 9, the adhesion between coating 3 and the amorphous metal forming first part 5 is improved. To achieve this, coating 3 includes a means of adhesion 7. This means of adhesion 7 takes the form of roughness, porosity or portions in relief 8. These portions in relief 8 are made on the layer that will be in contact with the amorphous metal when the latter is overmoulded in negative 1. If coating 3 has only one layer, portions in relief 8 will be made on this single layer. Conversely, if coating 3 has several layers 31, 32, as seen in FIG. 8, portions in relief 8 will preferably be made on the last layer of coating 3 to be deposited, i.e. layer 32 in FIG. 8. The situation is the same if coating 3 has three or four layers.

These portions in relief 8 take the form of projecting portions or recesses. These portions in relief 8 therefore allow the shaping properties of amorphous materials to be used. Indeed, as stated above, amorphous materials have the advantage of very accurately reproducing fine, precise geometries, since the viscosity of amorphous metal decreases sharply and the metal therefore adopts all the details of the negative 1 including portions in relief 8. Said portions in relief thus anchor the amorphous metal to said coating 3 and thus provide resistance to detachment and improved adhesion of coating 3 to first part 5.

These portions in relief 8 are formed, for example, during the deposition of coating 3 by varying the deposition parameters. These portions in relief 8 could also, for example, be formed by photolithography, laser or plasma etching or micro-sandblasting. Portions in relief 8 are preferably made on the sides 33 of said coating 3 made on negative 1 so as to act as a vertical holding means, thereby preventing coating 3 from becoming detached from amorphous metal first part 5.

Figure 10:
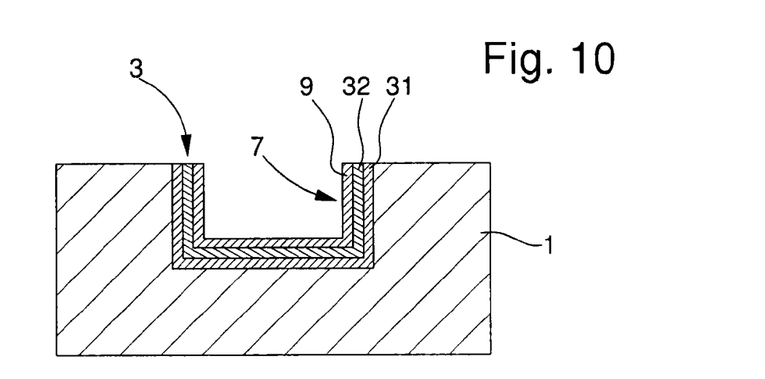
FIG. 10 shows a schematic view of a coating according to a second variant of the present invention.
Figure 11:
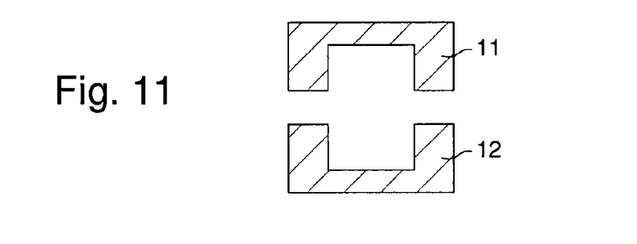
FIGS. 11 to 16 show schematic views of a first alternative of a fourth variant of the method according to the present invention.

In a second variant, adhesion is improved by the use of an intermediate layer 9. In fact, in this variant, the last layer deposited during the second step is a layer which favours the anchoring of said coating 3 to first part 5, i.e. which favours the anchoring of said coating 3 to the amorphous metal. This intermediate layer 9 may be specially deposited in addition to the layer forming coating 3 to achieve said anchoring, i.e. it is situated between the layer of coating 3 the closest to first part 5 and first part 5. However, it is possible to use an already existing layer, preferably the last deposited layer, to favour the anchoring of said coating 3. This means that in FIG. 8, where coating 3 includes two layers 31, 32, the intermediate layer would be layer 32. Further, it is of course possible to associate portions in relief 8 with an intermediate layer 9. The anchoring can then be achieved by using two different principles.

First of all, intermediate layer 9 is chosen to have great chemical affinity both with the layer of coating 3 on which said intermediate layer 9 is deposited and the first material forming first part 5. This great chemical affinity is characterized by an accelerated interdiffusion process between the atoms of intermediate layer 9 and the atoms of the layer of coating 3 on which intermediate layer 9 is deposited and the amorphous metal. This process consists in a mutual diffusion of atoms to connect the different materials to each other. The depth of diffusion is connected to the expansion coefficient of an atom in a network of other atoms, to the temperature which varies exponentially and to time which varies according to a square root. Generally, diffusion depths of 1-100 μm are possible values. However, if the thickness of the layer is equal to or less than 1 μm, the diffusion depths will be around 10 to 100 nm.

Secondly, the anchoring can be achieved by brazing. This solution consists in using intermediate layer 9 as the securing element for a braze. To achieve this, a material with a low melting temperature is used, such as tin, for example, which has a melting temperature of 231° C. This low melting temperature allows said intermediate layer 9 to change from solid form to liquid form during the hot forming of the amorphous metal. This then results in a braze between coating 3 and the amorphous material of first part 5 which provides good adhesion of said coating 3. Of course, the material forming intermediate layer 9 will be chosen so as not to damage coating 3 when said intermediate layer 9 melts. This intermediate layer 9 may have a thickness of between 1 to 10 μm.

Moreover, brazing via intermediate layer 9 could be achieved after the cooling of the first part but prior to the separation of said first part 5 from negative 3. Brazing is achieved by increasing the temperature of said first part 5 to melt intermediate layer 9 and thus to braze coating 3 and first part 5. The material forming intermediate layer 9 is chosen not to exceed the melting temperature of the material forming first part 5 and the material forming coating 3.

It is clear that these first two variants of the invention provide a finished part possessing the qualities of an amorphous metal. The drop in the viscosity of the amorphous metal in the range [Tg-Tx] means that it is possible to make parts which do not require the intrinsic qualities of amorphous metal, but which could not be obtained in another way, and where the amorphous metal properties are used only during creation of the parts.

In a third variant not shown in the Figures, the adhesion of coating 3 to first amorphous metal part 5 could be improved by crystallisation. This method can be used where the amorphous characteristic of the metal forming first part 5 is unnecessary. The amorphous nature of said metal is then only used for shaping.

Crystallisation consists of a sixth step performed either after the fifth step or during the fourth step. This step is carried out by heat treating the coated first part 6 at a higher temperature than the vitreous transition temperature of the amorphous metal. Depending on the temperature and time selected, the alloy will crystallise and could exhibit various microstructures such as for example a nano-crystalline structure. Of course, the temperature is adjusted so as not to damage coating 3. Crystallising the amorphous metal increases the interdiffusion process between the atoms of the adhesion layer and the metal atoms either by time or by temperature. As a result, the atoms of intermediate layer 9 and the metal atoms diffuse in each other thereby improving the adhesion between said coating 3 and first part 5.

Preferably, the first material forming first part 5 and the conditions of crystallisation are defined so as to allow dendrites rather than inter-metallic phases to form. These dendrites prevent the crystallised metal from being too brittle.

In a fourth variant, negative 1 in which first part 5 is made has two dies. Indeed, the first part 5 to be made may have a complex geometry meaning that said coating 3 cannot be deposited in good conditions.

Figure 12:
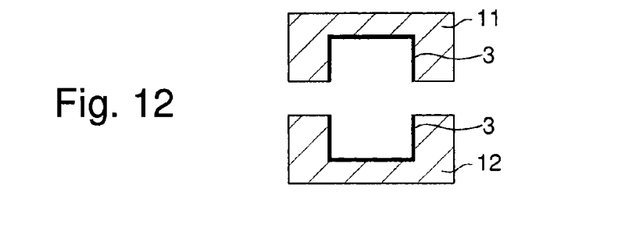
Figure 13:
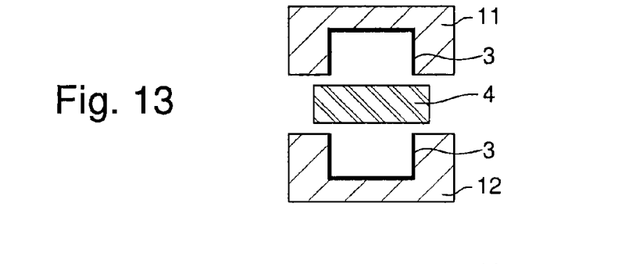
Figure 14:
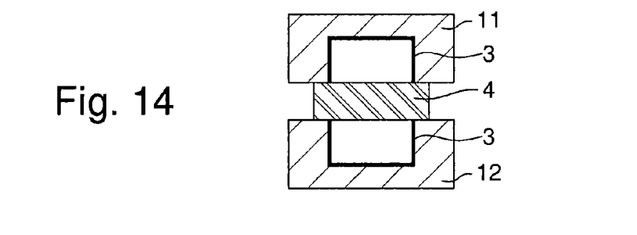
Figure 15:
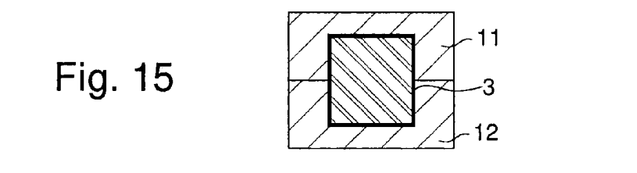
Figure 16:
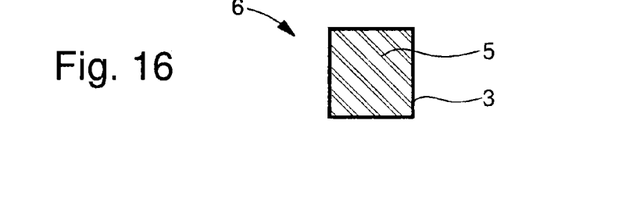
Figure 17:
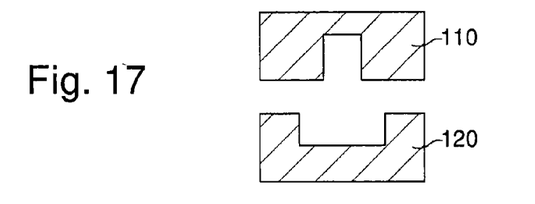
FIGS. 17 to 22 show schematic views of a second alternative of the fourth variant of the method according to the present invention.
Figure 18:
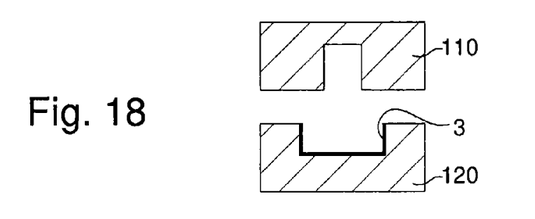
Figure 19:
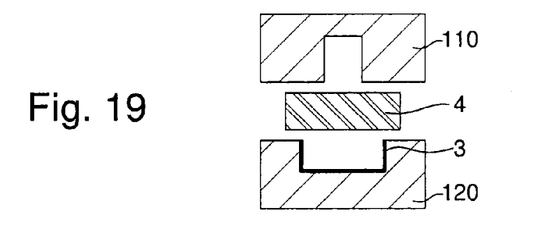
Figure 20:
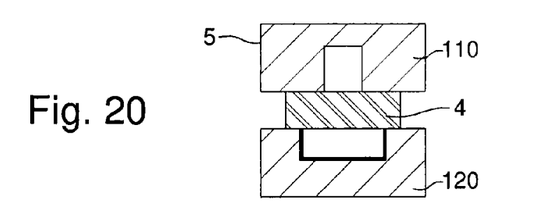
Figure 21:
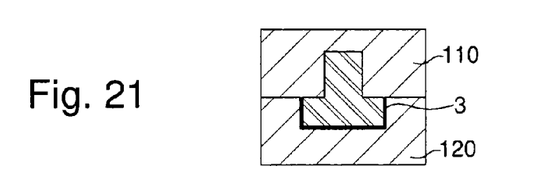
Figure 22:
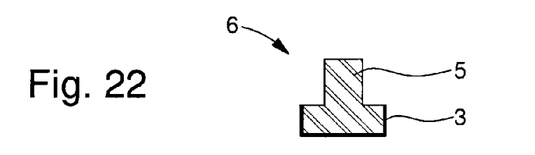

In a first alternative shown in FIGS. 11 to 16, the two dies 11 and 12 of negative 1 are used to make an entire coating 3. In fact, it is not possible to make an entirely coated first part 5 with the method disclosed in FIGS. 1 to 7. This is mainly due to the fact that a single die 1 is used. The solution is therefore to use two dies 11, 12, which are both coated with coating 3 as seen in FIG. 12. First part 5 is then made by the hot forming process described above and shown in FIGS. 13 to 15. A first coated part 6 is thus obtained, seen in FIG. 16. This part 6 is then entirely coated.

In a second alternative shown in FIGS. 17 to 22, only one of the dies 110, 120 includes coating 3. The advantage of this alternative is that a partially coated complex part can be made. For example, take the case where it is desired to make an amorphous metal screw with a screw head having a diamond coating 3 and a non-coated body. This part is complex since the screw head is wider than the body. Thus, the manufacture of this screw with a single die is very complex and it is also difficult to deposit coating 3 only on the screw head. One solution is that shown in FIG. 18. This means that a die 120 has a cavity 2 similar to that of the screw head and will be coated with diamond coating 3, whereas the second die 110 has a cavity 2 the shape of which is similar to that of the body of the screw and will not be coated. This means that, during the hot forming shown in FIGS. 18 to 20, the desired screw can be formed, i.e. a partially coated screw.

It will be clear that various alterations and/or improvements and/or combinations evident to those skilled in the art may be made to the various embodiments of the invention set out above without departing from the scope of the invention defined by the annexed claims.

Thus, it is clear that the first material forming first part 5 is a precious amorphous material.

It is also clear that the first step consisting in taking negative 1 may also include the preparation of said negative 1. Indeed, negative 1 can be decorated so that the surface states can be formed immediately on the coated first part 6. These surface states may be a "côte de Genève", circular grained, diamond swirl or satin decoration.

The implementation of one of the variants of the method according to the invention also means that different coatings can be applied to different surfaces of first part 5.

The coatings can also be superposed on certain surfaces. It is also possible, for example, to make coloured surfaces protected by a vitrified layer allowing all types of bold innovation in jewelry. It is also possible, during implementation of coating 3, to create decorations in two and/or three dimensions, such as logos, images or other decorations.

The invention claimed is:

1. A method of making a first part having at least one surface formed of a first material and coated with at least one coating on said at least one surface, said first material including at least one metallic element and being chosen for an ability thereof to become at least partially amorphous when subject to an increase in temperature above a melting temperature thereof which allows said material to lose any crystalline structure locally, followed by cooling to a temperature lower than a vitreous transition temperature thereof allowing said material to become at least partially amorphous, wherein said method comprises:
    taking a second part comprising a cavity forming a negative of the first part;
    depositing said coating, comprising at least a first layer, onto said second part;
    taking the first material;
    shaping the first material by filling said cavity of the second part with said first material so as to secure said coating to said at least one surface of said first part, said first material having been subject to a treatment allowing said material to become at least partially amorphous, at a latest at a time of said shaping;
    separating the first part from the second part so as to obtain said first part coated with said coating.

2. The production method according to claim 1, wherein the separating includes dissolving said second part.

3. The production method according to claim 1, wherein the shaping includes shaping said first material only after said material has been previously transformed into an at least partially amorphous preform, said preform being then subject to a temperature between the vitreous transition temperature and a crystallization temperature of the first material and then to a pressure working operation followed by a cooling operation allowing said first material to preserve an at least partially amorphous nature.

4. The production method according to claim 1, wherein said shaping is simultaneous with a treatment which makes said first material at least partially amorphous, by subjecting said material to a temperature higher than the melting temperature thereof followed by cooling at a lower temperature than the vitreous transition temperature thereof, which allows said material to become at least partially amorphous, during a casting operation.

5. The production method according to claim 1, wherein an adhesion structure that includes at least one recessed or projecting portion in relief is arranged on the coating so as to improve adhesion between said coating and the first part.

6. The production method according to claim 5, wherein said at least one portion in relief is achieved during said depositing of said coating.

7. The production method according to claim 5, wherein said at least one portion in relief is made by machining said coating.

8. The production method according to claim 1, wherein an adhesion structure that includes at least one recessed or projecting portion in relief is arranged on the coating so as to improve adhesion between said first layer on the one hand and said first part or another layer of said coating on the other hand.

9. The production method according to claim 8, wherein said at least one portion in relief is achieved during said depositing of said coating.

10. The production method according to claim 8, wherein said at least one portion in relief is made by machining said coating.

11. The production method according to claim 1, wherein an adhesion structure that includes an intermediate layer is arranged between a layer of the coating closest to the first part and the first part so as to improve adhesion between said coating and the first part.

12. The production method according to claim 11, wherein the intermediate layer includes a chemical affinity with the first material and the layer of the coating closest to the first part, or with the first material and a layer of the coating on which said intermediate layer is deposited, for accelerating an atom interdiffusion process thereby improving the adhesion of said coating to said first part.

13. The production method according to claim 11, wherein the intermediate layer is usable as a securing element to braze the layer of the coating closest to the first part or a layer of the coating on which said intermediate layer is deposited, with the first part during the shaping or after the shaping but prior to the separating.

14. The production method according to claim 1, wherein said coating includes at least one second layer and a layer of the coating closest to the first part is an intermediate layer acting as an adhesion structure between said coating and the first part so as to improve adhesion between said coating and the first part.

15. The production method according to claim 14, wherein the intermediate layer includes a chemical affinity with the first material and the layer of the coating closest to the first part, or with the first material and a layer of the coating on which said intermediate layer is deposited, for accelerating an atom interdiffusion process thereby improving the adhesion of said coating to said first part.

16. The production method according to claim 14, wherein the intermediate layer is usable as a securing element to braze the layer of the coating closest to the first part or a layer of the coating on which said intermediate layer is deposited, with the first part during the shaping or after the shaping but prior to the separating.

17. The production method according to claim 1, wherein after the separating the first part from the second part, the method further comprises:
   crystallizing the first part so as to accelerate interdiffusion between atoms of the coating and those of the first material.

18. The production method according to claim 1, wherein the first part further includes at least one other coating, said coatings being deposited on distinct surfaces of the first part.

19. The production method according to claim 1, wherein the depositing uses a CVD or PVD or electrodeposition method for deposition of said coating.

20. The production method according to claim 1, wherein said first material is totally amorphous when subject to the increase in temperature above the melting temperature thereof which allows said material to lose any crystalline structure locally, followed by cooling to the temperature lower than the vitreous transition temperature thereof allowing said material to become totally amorphous.

21. The production method according to claim 1, wherein said first metallic material is an alloy.

22. The production method according to claim 21, wherein a composition of said first material is 41.2% atomic percent Zr, 13.8% atomic percent Ti, 12.5% atomic percent Cu, 10% atomic percent Ni, and 22.5% atomic percent Be.

* * * * *